US012640725B2

(12) United States Patent
Wu et al.

(10) Patent No.: US 12,640,725 B2
(45) Date of Patent: May 26, 2026

(54) OVER-CURRENT PROTECTION CIRCUIT, OVER-CURRENT PROTECTION METHOD AND DISPLAY DEVICE

(71) Applicants: Beijing ESWIN Computing Technology Co., Ltd., Beijing (CN); HEFEI ESWIN INTEGRATED CIRCUIT CO., LTD., Hefei City (CN)

(72) Inventors: Jiajhang Wu, Beijing (CN); Dongmyung Lee, Beijing (CN); Jangjin Nam, Beijing (CN); Minsung Kim, Beijing (CN)

(73) Assignees: Beijing ESWIN Computing Technology Co., Ltd., Beijing (CN); HEFEI ESWIN INTEGRATED CIRCUIT CO., LTD., Hefei City (CN)

( * ) Notice: Subject to any disclaimer, the term of this patent is extended or adjusted under 35 U.S.C. 154(b) by 525 days.

(21) Appl. No.: 18/167,939

(22) Filed: Feb. 13, 2023

(65) Prior Publication Data

US 2023/0421147 A1 Dec. 28, 2023

(30) Foreign Application Priority Data

Jun. 22, 2022 (CN) .......................... 202210715562.9

(51) Int. Cl.
*H02H 7/00* (2006.01)
*G09G 5/00* (2006.01)
(Continued)

(52) U.S. Cl.
CPC ......... *H03K 17/0822* (2013.01); *G09G 5/003* (2013.01); *H02M 1/0009* (2021.05); *H02M 3/158* (2013.01); *G09G 2330/04* (2013.01)

(58) Field of Classification Search
None
See application file for complete search history.

(56) References Cited

U.S. PATENT DOCUMENTS

| | | | | | |
|---|---|---|---|---|---|
| 6,025,980 | A | * | 2/2000 | Morron | ..................... H02H 3/33 361/45 |
| 7,554,409 | B1 | * | 6/2009 | Zhang | ..................... H03F 1/523 330/10 |

(Continued)

FOREIGN PATENT DOCUMENTS

| | | |
|---|---|---|
| CN | 101127509 A | 2/2008 |
| CN | 101557203 A | 10/2009 |

(Continued)

OTHER PUBLICATIONS

Translation of First Office Action for corresponding Chinese Application No. CN2022107155629, dated Aug. 15, 2025, 20 pages.
Translation of Chinese Office Action for corresponding Chinese Application No. CN2022107155629, dated Mar. 17, 2026, 20 pages.

*Primary Examiner* — Stephen W Jackson

(74) *Attorney, Agent, or Firm* — Westman, Champlin & Koehler, P.A.

(57) ABSTRACT

Disclosed is an over-current protection circuit, an over-current protection method and a display device. The over-current protection circuit provides an over-current protection for an operational amplifier and the over-current protection circuit comprises: a comparison module to compare a reference voltage and an output stage current sampling signal of the operational amplifier to determine whether an output stage current of the operational amplifier exceeds a protection threshold; a delay module to determine whether the output stage current of the operational amplifier exceeds the protection threshold for a time that reaches a preset time threshold, and output an over-current protection signal to turn off the operational amplifier when the output stage current of the operational amplifier exceeds the protection threshold for a time that reaches the preset time threshold. The present disclosure can effectively prevent the drive IC from being damaged by the continuous large current flowing through the drive IC.

17 Claims, 5 Drawing Sheets

(51) Int. Cl.
    *H02M 1/00*        (2006.01)
    *H02M 3/158*      (2006.01)
    *H03K 17/082*   (2006.01)

(56)           References Cited

U.S. PATENT DOCUMENTS

| | | | |
|---|---|---|---|
| 2009/0052103 A1* | 2/2009 | Beny | H03F 3/45475 |
| | | | 361/91.1 |
| 2009/0116160 A1* | 5/2009 | Fan | H02H 3/087 |
| | | | 361/92 |
| 2013/0314835 A1* | 11/2013 | Tseng | H03F 1/52 |
| | | | 361/93.8 |
| 2019/0123541 A1* | 4/2019 | Takuma | B60R 16/03 |

FOREIGN PATENT DOCUMENTS

| | | | |
|---|---|---|---|
| CN | 102522725 A | 6/2012 |
| CN | 202651748 U | 1/2013 |
| CN | 104991142 A | 10/2015 |
| CN | 108649805 A | 10/2018 |
| CN | 112736852 A | 4/2021 |
| CN | 213213087 U | 5/2021 |
| CN | 114284989 A | 4/2022 |
| CN | 114387932 A | 4/2022 |
| CN | 114649796 A | 6/2022 |
| CN | 115241839 A | 10/2022 |
| JP | 2019180044 A | 10/2019 |

* cited by examiner

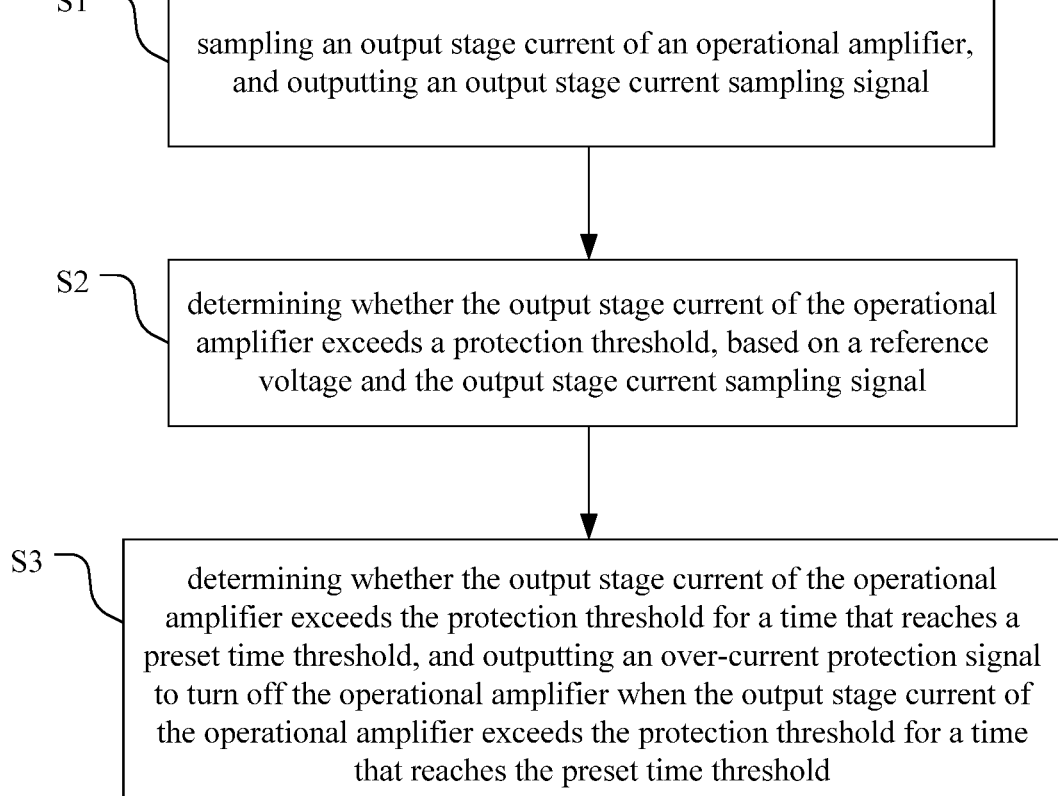

S1 sampling an output stage current of an operational amplifier, and outputting an output stage current sampling signal

S2 determining whether the output stage current of the operational amplifier exceeds a protection threshold, based on a reference voltage and the output stage current sampling signal

S3 determining whether the output stage current of the operational amplifier exceeds the protection threshold for a time that reaches a preset time threshold, and outputting an over-current protection signal to turn off the operational amplifier when the output stage current of the operational amplifier exceeds the protection threshold for a time that reaches the preset time threshold

Fig. 6

OVER-CURRENT PROTECTION CIRCUIT, OVER-CURRENT PROTECTION METHOD AND DISPLAY DEVICE

CROSS-REFERENCE TO RELATED APPLICATIONS

The present application claims priority to Chinese Patent Application No. 202210715562.9, filed on Jun. 22, 2022, entitled by "OVER-CURRENT PROTECTION CIRCUIT, OVER-CURRENT PROTECTION METHOD AND DIS-PLAY DEVICE", and published as CN115241839A on Oct. 25, 2022, which is incorporated herein by reference in its entirety.

FIELD OF TECHNOLOGY

The present disclosure relates to a technical field of electronic circuits, in particular to an over-current protection circuit, an over-current protection method and a display device.

BACKGROUND

With the rapid development of modern science and technology and the improvement of research capacity, new technologies have put forward higher requirements for basic components such as electronic circuits, especially in the field of signal amplifiers related to signal acquisition, ampli-fication, and transmission, etc. In order to meet the needs of scientific and technological research and practical applica-tions, a precision unit gain operational amplifier with a strong drive capability has been developed rapidly.

In an LCD drive system, an operational amplifier is usually arranged in a drive IC to obtain a strong drive capability. However, with the increase of screen resolution, the number of drive IC in use and the specification of a drive current are gradually increased. In this way, when an output is falsely connected to a power supply or a reference ground in an assembly process of a production line operation, a large current will be generated, which may damage the drive IC and even other components in the LCD drive system.

Therefore, it is necessary to provide improved technical solutions to overcome the above technical problems in the prior art.

SUMMARY

In order to solve the above technical problems, the present disclosure provides an over-current protection circuit, an over-current protection method and a display device. Wherein, whether a current inside a drive IC exceeds a steady state design current value for a long time is deter-mined by detecting an output stage current of an operational amplifier, and if it is determined that the current inside the drive IC exceeds the steady state design current value for a long time, an over-current protection signal is outputted to turn off a corresponding circuit block, which can effectively prevent the drive IC from being damaged by a continuous large current flowing through the drive IC.

According to a first aspect of the present disclosure, an over-current protection circuit used to provide an over-current protection for an operational amplifier is provided, wherein the over-current protection circuit comprises:

a comparison module configured to compare a reference voltage and an output stage current sampling signal of the operational amplifier to determine whether an out-put stage current of the operational amplifier exceeds a protection threshold;

a delay module configured to determine whether the output stage current of the operational amplifier exceeds the protection threshold for a time that reaches a preset time threshold, and output an over-current protection signal to turn off the operational amplifier when the output stage current of the operational ampli-fier exceeds the protection threshold for a time that reaches the preset time threshold.

In some embodiments, an output stage circuit of the operational amplifier comprises a first switch transistor, a second switch transistor, a first sampling resistor, and a second sampling resistor, wherein, the first switch transistor and the second switch transistor are connected in series between a power supply and a reference ground, the first sampling resistor is connected in series between the power supply and the first switch transistor, and the second sam-pling resistor is connected in series between the second switch transistor and the reference ground;

the output stage current sampling signal comprises a first sampling signal and a second sampling signal, and the operational amplifier is configured to provide the first sampling signal and the second sampling signal to the over-current protection circuit based on the first sam-pling resistor and the second sampling resistor, respec-tively.

In some embodiments, the comparison module is config-ured to determine that the output stage current of the operational amplifier exceeds the protection threshold, when the first sampling signal is less than a corresponding first reference voltage or the second sampling signal is greater than a corresponding second reference voltage.

In some embodiments, the comparison module is config-ured to output an indication signal of high level, when the output stage current of the operational amplifier exceeds the protection threshold;

the delay module is configured to charge a capacitor with the indication signal of high level and output the over-current protection signal when a voltage across the capacitor reaches a preset voltage threshold, to determine whether the output stage current of the operational amplifier exceeds the protection threshold for a time that reaches the preset time threshold accord-ing to a charging time for charging the capacitor by use of the indication signal of high level.

In some embodiments, the comparison module comprises a first comparator, a second comparator, and a first OR gate logic circuit, wherein, an inverting input terminal of the first comparator is configured to receive the first sampling signal, and a non-inverting input terminal of the first comparator is configured to receive the first reference voltage;

a non-inverting input terminal of the second comparator is configured to receive the second sampling signal, and an inverting input terminal of the second comparator is configured to receive the second reference voltage;

a first input terminal of the first OR gate logic circuit is coupled with an output terminal of the first comparator, a second input terminal of the first OR gate logic circuit is coupled with an output terminal of the second comparator, and an output terminal of the first OR gate logic circuit is configured to output an indication sig-nal.

In some embodiments, a first power supply voltage serves as an operating voltage of the first comparator and an operating voltage of the second comparator, a second power supply voltage serves as an operating voltage of the first OR gate logic circuit, and the first power supply voltage is greater than the second power supply voltage;

the comparison module further comprises:

a first voltage conversion unit, which is connected in series between the output terminal of the first comparator and the first input terminal of the first OR gate logic circuit, and configured to convert a high-level signal corresponding to the first power supply voltage into the second power supply voltage, when the first comparator outputs that high-level signal corresponding to the first power supply voltage, wherein an operating voltage of the first voltage conversion unit is the second power supply voltage;

a second voltage conversion unit, which is connected in series between the output terminal of the second comparator and the second input terminal of the first OR gate logic circuit, and configured to convert a high-level signal corresponding to the first power supply voltage into the second power supply voltage, when the second comparator outputs that high-level signal corresponding to the first power supply voltage, wherein an operating voltage of the second voltage conversion unit is the second power supply voltage.

In some embodiments, the comparison module comprises a first comparator, a second comparator, a first inverter, a second inverter, and a first OR gate logic circuit, wherein, a non-inverting input terminal of the first comparator is configured to receive the first sampling signal, and an inverting input terminal of the first comparator is configured to receive the first reference voltage;

an inverting input terminal of the second comparator is configured to receive the second sampling signal, and a non-inverting input terminal of the second comparator is configured to receive the second reference voltage;

an input terminal of the first inverter is coupled with an output terminal of the first comparator;

an input terminal of the second inverter is coupled with an output terminal of the second comparator;

a first input terminal of the first OR gate logic circuit is coupled with an output terminal of the first inverter, a second input terminal of the first OR gate logic circuit is coupled with an output terminal of the second inverter, and an output terminal of the first OR gate logic circuit is configured to output an indication signal, wherein, a first power supply voltage serves as an operating voltage of the first comparator and an operating voltage of the second comparator, a second power supply voltage serves as an operating voltage of the first inverter, an operating voltage of the second inverter and an operating voltage of the first OR gate logic circuit, and the first power supply voltage is greater than the second power supply voltage.

In some embodiments, the delay module comprises a low-pass filter and a hysteresis comparator, the low-pass filter is coupled with the comparison module to receive the indication signal, and configured to delay and output the indication signal of high level;

an input terminal of the hysteresis comparator is coupled with an output terminal of the low-pass filter, and the hysteresis comparator is configured to output the over-current protection signal when an output signal of the low-pass filter reaches the preset voltage threshold.

In some embodiments, the delay module is further configured to latch an over-current protection state triggered by the operational amplifier, after it is determined that the output stage current of the operational amplifier exceeds the protection threshold for a time that reaches the preset time threshold.

In some embodiments, the delay module further comprises a second OR gate logic circuit, a first input terminal of the second OR gate logic circuit is coupled with an output terminal of the comparison module, a second input terminal of the second OR gate logic circuit is coupled with an output terminal of the hysteresis comparator, and an output terminal of the second OR gate logic circuit is coupled with an input terminal of the low-pass filter.

In some embodiments, the delay module further comprises a third voltage conversion unit, an input terminal of the third voltage conversion unit is connected with the output terminal of the hysteresis comparator, and the third voltage conversion unit is configured to raise a voltage value of the over-current protection signal outputted by the hysteresis comparator to a first power supply voltage.

In some embodiments, the over-current protection circuit further comprises:

a state control module, configured to respectively receive a first reset signal, a second reset signal and an over-current protection mode signal, and control the over-current protection circuit in an inoperative state when the first reset signal is valid, and/or the second reset signal is valid, and/or the over-current protection mode signal is invalid, wherein, the first reset signal is used to indicate whether a first power supply voltage is currently in a power on stage, the second reset signal is used to indicate whether a second power supply voltage is currently in a power on stage, and the over-current protection mode signal is used to indicate whether an over-current protection function is enabled.

According to a second aspect of the present disclosure, a display device is provided, wherein the display device comprises:

a display panel;

a drive chip, configured to provide a drive signal for the display panel;

wherein, at least one operational amplifier and at least one over-current protection circuit are arranged in the drive chip, and each of the at least one over-current protection circuit is configured to provide an over-current protection for a corresponding one of the at least one operational amplifier.

According to a third aspect of the present disclosure, an over-current protection method used to provide an over-current protection for an operational amplifier is provided, wherein the over-current protection method comprises:

sampling an output stage current of the operational amplifier, and outputting an output stage current sampling signal;

determining whether the output stage current of the operational amplifier exceeds a protection threshold, based on a reference voltage and the output stage current sampling signal;

determining whether the output stage current of the operational amplifier exceeds the protection threshold for a time that reaches a preset time threshold, and outputting an over-current protection signal to turn off the operational amplifier when the output stage current of the operational amplifier exceeds the protection threshold for a time that reaches the preset time threshold.

The technical solutions of the present disclosure can effectively avoid the damage of the drive IC caused by the continuous large current flowing through the drive IC.

It should be noted that, the above general description and the following detailed description are only exemplary and explanatory, and not a limit to the present disclosure.

BRIEF DESCRIPTION OF THE DRAWINGS

FIG. 6 shows a flowchart of an over-current protection method according to an embodiment of the present disclosure.

DESCRIPTION OF THE EMBODIMENTS

In order to facilitate an understanding of the present disclosure, a more comprehensive description of the present disclosure will be given below with reference to the related accompanying drawings. Preferred embodiments of the present disclosure are shown in the accompanying drawings. However, the present disclosure can be implemented in different forms and is not limited to the embodiments described herein. On the contrary, in order to make a more thorough and comprehensive understanding of the present disclosure, these embodiments are provided.

Figures 1, 2:
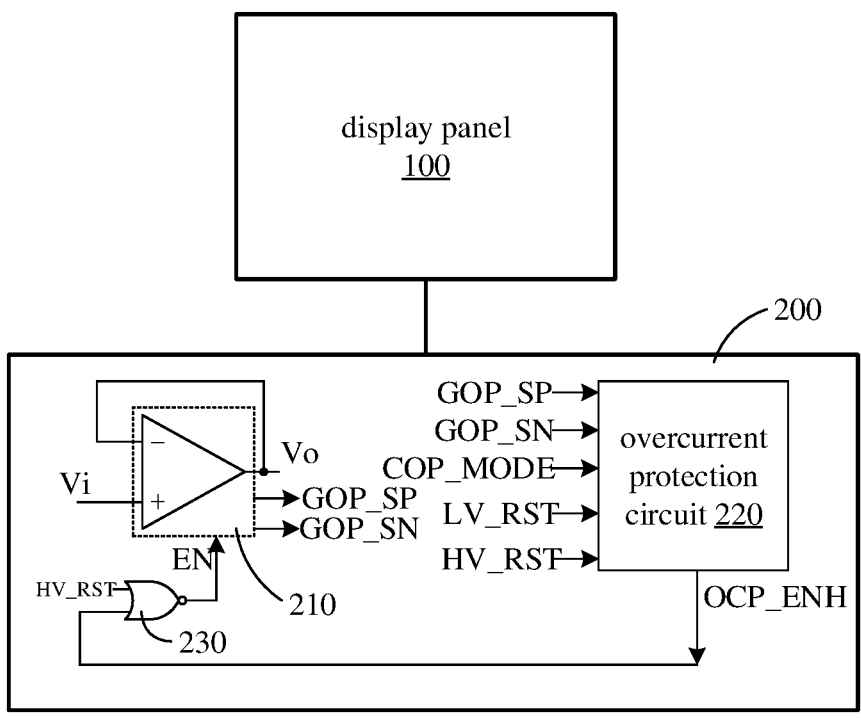
FIG. 1 shows a structural schematic view of a display device according to an embodiment of the present disclosure.
FIG. 2 shows a structural schematic view of an over-current protection circuit according to a first embodiment of the present disclosure.
Figure 3:
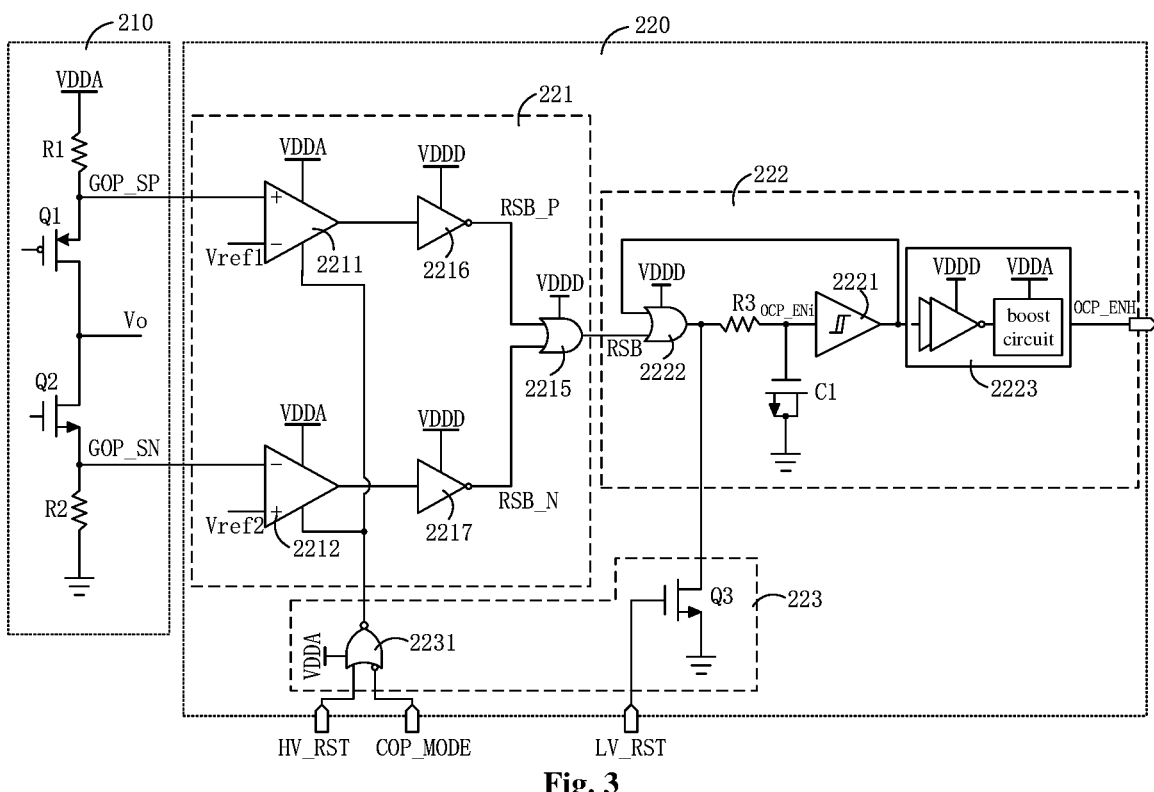
FIG. 3 shows a structural schematic view of an over-current protection circuit according to a second embodiment of the present disclosure.

FIG. 1 shows a structural schematic view of a display device according to an embodiment of the present disclosure, FIG. 2 shows a structural schematic view of an over-current protection circuit according to a first embodiment of the present disclosure, and FIG. 3 shows a structural schematic view of an over-current protection circuit according to a second embodiment of the present disclosure.

As shown in FIG. 1, the display device in the present disclosure comprises a display panel 100 and a drive chip 200 used to provide a drive signal for the display panel 100.

The display panel 100 in the present disclosure can be a display panel in any form. An LCD display panel is taken as an example for description herein.

The driver chip 200 comprises one or more driver units, and each driver unit is configured to realize one or more specific functions. At least one operational amplifier 210 and at least one over-current protection circuit 220 are arranged in at least part of the drive units in the drive chip 200.

In an example of the present disclosure, the operational amplifier 210 is connected as a voltage follower structure to generate an output voltage Vo based on an input voltage Vi, so as to improve a drive capability of the driver chip 200. Each over-current protection circuit 220 is configured to provide an over-current protection for the corresponding operational amplifier 210.

The operational amplifier 210 comprises a reference bias circuit, an input stage circuit, an intermediate stage circuit, and an output stage circuit. In the embodiments of the present disclosure, the over-current protection circuit 220 is configured to mainly detect whether a current referred to as an output stage current herein of the output stage circuit of the operational amplifier 210 is an over-current and whether it is required to provide an over-current protection signal OCP_ENH for the operational amplifier 210, based on a current sampling signal of the output stage circuit provided by the operational amplifier 210, wherein the current sampling signal is also known as an output stage current sampling signal herein, and comprises a first sampling signal GOP_SP and a second sampling signal GOP_SN.

In an example of the present disclosure, an output signal of the over-current protection circuit 220 is transmitted to an enable terminal EN of the operational amplifier 210 after passing through an NOR gate logic circuit 230. Specifically, a first input terminal of the NOR gate logic circuit 230 is coupled with an output terminal of the over-current protection circuit 220, a second input terminal of the NOR gate logic circuit 230 receives a first reset signal HV_RST, and an output terminal of the NOR gate logic circuit 230 is coupled with the enable terminal EN of the operational amplifier 210.

Referring to FIG. 2 and FIG. 3, the output stage circuit of the operational amplifier 210 comprises a first switch transistor Q1 and a second switch transistor Q2 which are connected in series between a first power supply and a reference ground. The operational amplifier 210 outputs the output voltage Vo from an intermediate connection node of the first switch transistor Q1 and the second switch transistor Q2. Wherein, when the first switch transistor Q1 and the second switch transistor Q2 work in a linear area, the output voltage Vo is equal to the input voltage Vi. The output stage circuit of the operational amplifier 210 also comprises a first sampling resistor R1 connected in series between the first power supply and the first switch transistor Q1, and a second sampling resistor R2 connected in series between the second switch transistor Q2 and the reference ground. The operational amplifier 210 is configured to provide the first sampling signal GOP_SP and the second sampling signal GOP_SN to the over-current protection circuit 220 according to the first sampling resistor R1 and the second sampling resistor R2, respectively.

The over-current protection circuit 220 comprises a comparison module 221 and a delay module 222. The comparison module 221 is configured to compare a reference voltage (including a first reference voltage Vref1 and a second reference voltage Vref2) and the output stage current sampling signal of the operational amplifier 210 to determine whether the output stage current of the operational amplifier 210 exceeds a protection threshold, that is, to determine whether an over-current occurs. The delay module 222 is configured to determine whether the output stage current of the operational amplifier 210 exceeds the protection threshold for a time that reaches a preset time threshold, and output the over-current protection signal OCP_ENH to turn off the operational amplifier 210 when the output stage current of the operational amplifier 210 exceeds the protection threshold for a time that reaches the preset time threshold.

Specifically, the comparison module 221 is configured to determine that the output stage current of the operational amplifier 210 exceeds the protection threshold, when the first sampling signal GOP_SP is less than the corresponding first reference voltage Vref1 or the second sampling signal GOP_SN is greater than the corresponding second reference voltage Vref2. In an example of the present disclosure, it is possible that the first sampling signal GOP_SP is greater than the first reference voltage Vref1 and the second sampling signal GOP_SN is less than the second reference voltage Vref2 under normal conditions, by setting the appropriate first reference voltage Vref1 and second reference voltage Vref2. When an output terminal of the operational amplifier 210 is shorted to the reference ground, causing that the output stage current of the operational amplifier 210 is an over-current, the first sampling signal GOP_SP is less than the corresponding first reference voltage Vref1; when the output terminal of the operational amplifier 210 is shorted to a power supply terminal (e.g., for receiving a first power supply voltage VDDA), causing over-current on the output stage current of the operational amplifier 210, the second sampling signal GOP_SN is greater than the corresponding second reference voltage Vref2. In this way, it can be accurately determined whether the output stage current of the operational amplifier 210 exceeds the protection threshold, by comparing the output stage current sampling signal of the operational amplifier 210 with the corresponding reference voltage.

When the output stage current of the operational amplifier 210 exceeds the protection threshold, the comparison module 221 is configured to output an indication signal RSB of high level.

The delay module 222 is configured to charge a capacitor with the indication signal RSB of high level, and output the over-current protection signal OCP_ENH when a voltage across the capacitor reaches a preset voltage threshold. It should be noted that the indication signal RSB of high level needs to last for a certain time before charging the voltage across the capacitor to the preset voltage threshold. So, it can be determined whether the output stage current of the operational amplifier 210 exceeds the protection threshold for a time that reaches the preset time threshold according to a charging time for charging the capacitor by use of the indication signal RSB of high level.

In the present disclosure, an operating voltage of an analog device or circuit in the over-current protection circuit 220 can be set to a first power supply voltage VDDA, and an operating voltage of a digital device or circuit in the over-current protection circuit 220 can be set to a second power supply voltage VDDD. By arranging two power supply paths, the over-current protection circuit 220 can be widely used in products with different high and low voltage processes, and the digital device or circuit in the over-current protection circuit 220 will not be affected even in a high voltage process. Wherein, for the different high and low voltage processes, it only needs to change a voltage value of the first power supply voltage VDDA, and the circuit implementation is simple.

In an example of the present disclosure, as shown in FIG. 2, the comparison module 221 comprises a first comparator 2211, a second comparator 2212, and a first OR gate logic circuit 2215. In this example, an inverting input terminal of the first comparator 2211 receives the first sampling signal GOP_SP, and a non-inverting input terminal of the first comparator 2211 receives the first reference voltage signal Vref1. A non-inverting input terminal of the second comparator 2212 receives the second sampling signal GOP_SN, and an inverting input terminal of the second comparator 2212 receives the second reference voltage signal Vref2. A first input terminal of the first OR gate logic circuit 2215 is coupled with an output terminal of the first comparator 2211 to receive a first comparison signal RSB_P, a second input terminal of the first OR gate logic circuit 2215 is coupled with an output terminal of the second comparator 2212 to receive a second comparison signal RSB_N, and an output terminal of the first OR gate logic circuit 2215 is an output terminal of the comparison module 221, which is used to output the indication signal RSB. Wherein, an operating voltage of the first comparator 2211 and an operating voltage of the second comparator 2212 are both the first power supply voltage VDDA, and an operating voltage of the first OR gate logic circuit 2215 is the second power supply voltage VDDD.

On the basis of this example, taking the first power supply voltage VDDA being greater than the second power supply voltage VDDD as an example, in some embodiments, the comparison module 221 also comprises a first voltage conversion unit 2213 and a second voltage conversion unit 2214, and an operating voltage of the first voltage conversion unit 2213 and an operating voltage of the second voltage conversion unit 2214 are the second power supply voltage VDDD. Wherein, the first voltage conversion unit 2213 is connected in series between the output terminal of the first comparator 2211 and the first input terminal of the first OR gate logic circuit 2215 and configured to convert a high-level signal corresponding to the first power supply voltage VDDA into the second power supply voltage VDDD, when the first comparator 2211 outputs that high-level signal corresponding to the first power supply voltage VDDA. The second voltage conversion unit 2214 is connected in series between the output terminal of the second comparator 2212 and the second input terminal of the first OR gate logic circuit 2215 and configured to convert a high-level signal corresponding to the first power supply voltage VDDA into the second power supply voltage VDDD, when the second comparator 2212 outputs that high-level signal corresponding to the first power supply voltage VDDA. Through the first voltage conversion unit 2213 and the second voltage conversion unit 2214, a conversion from a high voltage signal to a low voltage signal can be realized, which facilitates a transmission of a signal from a high-voltage device to a low-voltage device.

Further, in this example, corresponding path selection switch can be arranged in the comparison module 221. When the first power supply voltage VDDA is equal to the second power supply voltage VDDD, the first voltage conversion unit 2213 and the second voltage conversion unit 2214 can be shorted out through the path selection switch to reduce power consumption.

It should be noted that the voltage value of the high-voltage signal described herein corresponds to the first power supply voltage VDDA, and the voltage value of the low-voltage signal described herein corresponds to the second power supply voltage VDDD. In addition, the low-voltage signal corresponding to the second power supply voltage VDDD herein is only a description way relative to the high-voltage signal corresponding to the first power supply voltage VDDA. In fact, the low-voltage signal corresponding to the second power supply voltage VDDD is still a high-level logic signal.

In some embodiments, the above functions of the first voltage conversion unit 2213 and the second voltage conversion unit 2214 can be realized by two inverters connected in series, both of which have the operating voltages being set to the second power supply voltage VDDD. Alternatively, the first voltage conversion unit 2213 and the second voltage conversion unit 2214 are both a buck circuit.

In another example of the present disclosure, as shown in FIG. 3, the comparison module 221 comprises a first comparator 2211, a second comparator 2212, a first inverter 2216, a second inverter 2217, and a first OR gate logic circuit 2215. In this example, a non-inverting input terminal of the first comparator 2211 receives the first sampling signal GOP_SP, and an inverting input terminal of the first comparator 2211 receives the first reference voltage signal Vref1. An inverting input terminal of the second comparator 2212 receives the second sampling signal GOP_SN, and a non-inverting phase input terminal of the second comparator 2212 receives the second reference voltage signal Vref2. An input terminal of the first inverter 2216 is coupled with an output terminal of the first comparator 2211. An input terminal of the second inverter 2217 is coupled with an output terminal of the second comparator 2212. A first input terminal of the first OR gate logic circuit 2215 is coupled with an output terminal of the first inverter 2216, a second input terminal of the first OR gate logic circuit 2215 is coupled with an output terminal of the second inverter 2217, and an output terminal of the first OR gate logic circuit 2215 is an output terminal of the comparison module 221, which is used to output the indication signal RSB. Wherein, an operating voltage of the first comparator 2211 and an operating voltage of the second comparator 2212 are the first power supply voltage VDDA, and an operating voltage of the first inverter 2216, an operating voltage of the second inverter 2217 and an operating voltage of the first OR gate logic circuit 2215 are the second power supply voltage VDDD.

Taking the first power supply voltage VDDA being greater than the second power supply voltage VDDD as an example, in this example, based on the connection structure of the first comparator 2211, the second comparator 2212, the first inverter 2216 and the second inverter 2217, the first inverter 2216 can directly output a high-level logic signal corresponding to the second power supply voltage VDDD, when the first sampling signal GOP_SP is less than the first reference voltage signal Vref1, or the second inverter 2217 can directly output a high-level logic signal corresponding to the second power supply voltage VDDD, when the second sampling signal GOP_SN is greater than the second reference voltage signal Vref2. Compared with the previous example, fewer components are required.

In the present disclosure, the delay module 222 comprises a low-pass filter, a hysteresis comparator 2221 and a third voltage conversion unit 2223. Wherein, the low pass filter is coupled with the comparison module 221 to receive the indication signal RSB, and is used to delay and output the indication signal RSB of high level. An input terminal of the hysteresis comparator 2221 is coupled with an output terminal of the low-pass filter, and the hysteresis comparator 2221 is used to output the over-current protection signal OCP_ENH, when a voltage value of an output signal of the low-pass filter reaches the preset voltage threshold. An input terminal of the third voltage conversion unit 2223 is connected with an output terminal of the hysteresis comparator 2221, and the third voltage conversion unit 2223 is used to raise a voltage value of the over-current protection signal OCP_ENH outputted by the hysteresis comparator 2221 to the first power supply voltage VDDA and output the over-current protection signal OCP_ENH, to ensure that the voltage value of the over-current protection signal OCP_ENH outputted by the over-current protection circuit 220 can control the operational amplifier 210 to be turned off.

The low-pass filter comprises a resistor R3 and a capacitor C1. A first end of the resistor R3 corresponds to an input terminal of the low-pass filter, a second end of the resistor R3 corresponds to the output terminal of the low-pass filter, and the capacitor C1 is connected between the second end of the resistor R3 and the reference ground. It is well known to those skilled in the art that when an input voltage of the low-pass filter, a resistance value of the resistor R3 and a capacitance value of the capacitor C1 are determined, a voltage across the capacitor C1, that is, an output voltage of the low-pass filter, is uniquely determined with a charging time of the capacitor C1. Therefore, when the voltage across the capacitor C1 reaches the preset voltage threshold, it means that the charging time of the capacitor C1 has reached a preset delay time. It can be understood that by reasonably changing the preset voltage threshold, and/or the resistance value of the resistor R3, and/or the capacitance value of the capacitor C1, the delay duration (i.e., the time threshold) of the delay module 222 can be adjusted. In addition, only an example of realizing the function of the capacitor C1 with a field effect transistor is shown in the accompanying drawings of the present disclosure to reduce the circuit size, wherein a gate of the field effect transistor is connected to the second end of the resistor R3, and a source and a drain of the field effect transistor are connected to the reference ground after being shorted. However, in other examples of the present disclosure, a capacitor and the resistor R3 can also be directly used to form the low-pass filter, to facilitate the replacement of capacitors with different capacitance values.

In a preferred example, the delay module 222 also comprises a second OR gate logic circuit 2222. A first input terminal of the second OR gate logic circuit 2222 is coupled with the output terminal of the first OR gate logic circuit 2215, a second input terminal of the second OR gate logic circuit 2222 is coupled with the output terminal of the hysteresis comparator 2221, and an output terminal of the second OR gate logic circuit 2222 is coupled with the input terminal of the low-pass filter. Through the second OR gate logic circuit 2222, after the output stage current of the operational amplifier 221 exceeds the protection threshold for a time that reaches the preset time threshold, an over-current protection state triggered by the operational amplifier 221 can be directly latched, so that it is not required to continuously detect the output stage current of the operational amplifier 221. Accordingly, after the over-current protection state is latched, the comparison module 221 can be controlled in an inoperative state to reduce the power consumption. In this example, when the operational amplifier 221 triggers the over-current protection and latches the state, the normal operating state can be restored until the fault is eliminated and the system is restarted, which is conducive to achieve an over-current protection with higher quality.

In some embodiments, for example, the third voltage conversion unit 2223 can be composed of two inverters connected in series of which the operating voltages are the second power supply voltage VDDD and a boost circuit of which the operating voltage is the first power supply voltage VDDA. Or the third voltage conversion unit 2223 can be directly composed of a boost circuit of which the operating voltage is the first power supply voltage VDDA.

Referring further to FIG. 2 and FIG. 3, in a preferred example, the over-current protection circuit 220 also comprises a state control module 223. The state control module 223 is configured to respectively receive a first reset signal HV_RST, a second reset signal LV_RST and an over-current protection mode signal COP_MODE, and control the over-current protection circuit 220 in an inoperative state, when the first reset signal HV_RST is valid, and/or the second reset signal LV_RST is valid, and/or the over-current protection mode signal COP_MODE is invalid. Wherein, the first reset signal HV_RST is used to indicate whether the first power supply voltage VDDA is currently in a power on stage, the second reset signal LV_RST is used to indicate whether the second power supply voltage VDDD is currently in a power on stage, and the over-current protection mode signal COP_MODE is used to indicate whether an over-current protection function is enabled. Based on the state control module 223, a circuit state of the operational amplifier 210 can be effectively identified to avoid the false triggering of the over-current protection state and ensure the high-quality operation of the system.

For example, when the first reset signal HV_RST is valid, it can indicate that the system is currently in the power on stage of the first power supply voltage VDDA, and at this time, it is not required to perform the over-current protection on the drive IC or the operational amplifier; when the first reset signal HV_RST is invalid, it can indicate that the power on stage of the first power supply voltage VDDA of the system has been finished, and at this time, it can be further determined whether the over-current protection is required to be performed on the drive IC or the operational amplifier according to other indication signals of the system.

For example, when the second reset signal LV_RST is valid, it can indicate that the system is currently in the power on stage of the second power supply voltage VDDD, and at this time, it is not required to perform the over-current protection on the drive IC or the operational amplifier; when the second reset signal LV_RST is invalid, it can indicate that the power on stage of the second power supply voltage VDDD of the system has been finished, and at this time, it can be further determined whether the over-current protection is required to be performed on the drive IC or the operational amplifier according to other indication signals of the system.

For example, when the over-current protection mode signal COP_MODE is valid, it can indicate that the over-current protection function of the drive IC or the operational amplifier is enabled. At this time, it can be further determined whether the over-current protection is required to be performed on the drive IC or the operational amplifier according to other indication signals of the system; when the over-current protection mode signal COP_MODE is invalid, it can indicate that the over-current protection function of the drive IC or the operational amplifier is not enabled. At this time, it is not required to perform the over-current protection on the drive IC or the operational amplifier.

In some embodiments, the state control module 223 comprises an NOR gate logic circuit 2231 and a third switch transistor Q3. Wherein, a first input terminal of the NOR gate logic circuit 2231 receives the first reset signal HV_RST, a second input terminal of the NOR gate logic circuit 2231 receives an inverting signal of the over-current protection mode signal COP_MODE, and an output terminal of the NOR gate logic circuit 2231 is coupled with the comparison module 221. A first current input terminal of the third switch transistor Q3 is connected with the input terminal of the low-pass filter, a second current input terminal of the third switch transistor Q3 is connected with the reference ground, and a control terminal of the third switch transistor Q3 receives the second reset signal LV_RST. Wherein, for example, the third switch transistor Q3 is an NMOS transistor.

Figure 4:
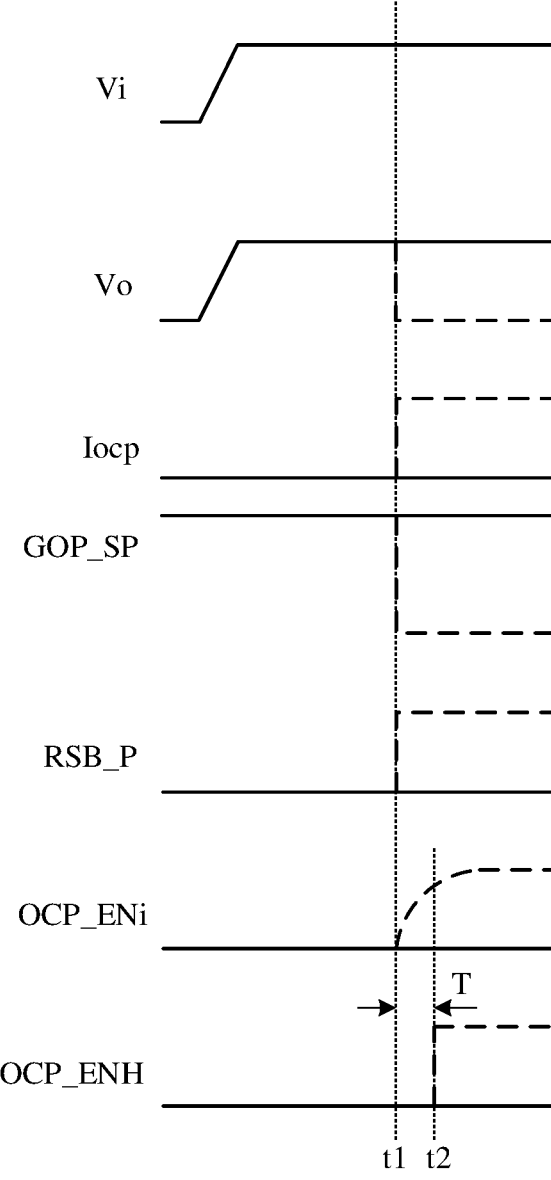
FIG. 4 shows a schematic waveform diagram of various signals in a system when an output terminal of an operational amplifier is shorted to a reference ground.
Figure 5:
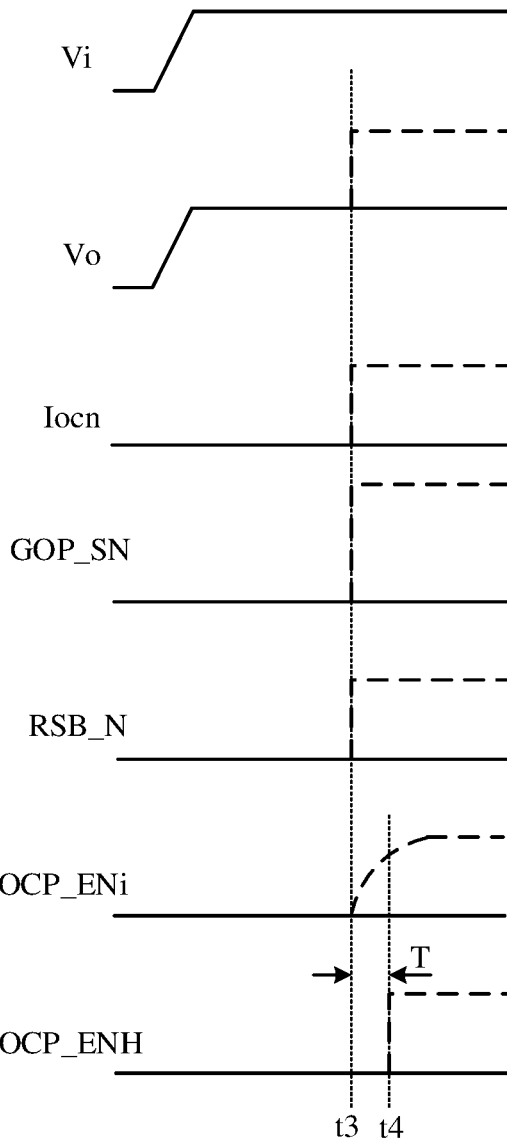
FIG. 5 shows a schematic waveform diagram of various signals in a system when an output terminal of an operational amplifier is shorted to a power supply.

The working process of the over-current protection circuit 220 in the present disclosure will be generally described below in combination with FIG. 4 and FIG. 5. Wherein, FIG. 4 shows a schematic waveform diagram of various signals in a system when an output terminal of an operational amplifier is shorted to a reference ground, and FIG. 5 shows a schematic waveform diagram of various signals in a system when an output terminal of an operational amplifier is shorted to a power supply. Wherein, solid lines in the schematic waveform diagram represent the waveforms of the various signals in the system under a normal operating condition, and the dotted lines in the schematic waveform diagram represent the waveforms of the various signals in the system under an abnormal operating condition, for example, when an output terminal of the operational amplifier is shorted.

As shown in FIG. 4, under the normal operating state, the output voltage Vo of the operational amplifier 210 changes with the input voltage Vi. However, if the output terminal of the operational amplifier 210 is shorted to the reference ground at time t1, the output voltage Vo of the operational amplifier 210 will drop to a reference ground potential (such as 0 V). At this time, a current Iocp which flows through the first switch transistor Q1 in the output stage circuit of the operational amplifier 210 will rapidly increase and exceed the over-current threshold (such as 100 mA), and the first sampling signal GOP_SP sampled based on the first sampling resistor R1 will correspondingly reduce to less than the first reference voltage Vref1, then the first comparison signal RSB_P received by the first input terminal of the first OR gate logic circuit 2215 becomes high level, so that the indication signal RSB outputted by the first OR gate logic circuit 2215 also becomes high level and the indication signal RSB of high level starts to charge the capacitor C1 in the low-pass filter at this time. If the voltage OCP_ENi across the capacitor C1 reaches the preset voltage threshold (for example, 0.7 VDDD) at time t2 after the preset time threshold T, the hysteresis comparator 2221 will output a high-level signal corresponding to the second power supply voltage VDDD at time t2, and the over-current protection signal OCP_ENH corresponding to the first power supply voltage VDDA is generated to turn off the operational amplifier 210 after the high-level signal corresponding to the second power supply voltage VDDD is converted by the third voltage conversion unit 2223. At the same time, the high-level signal outputted by the hysteresis comparator 2221 will also be fed back to the input terminal of the second OR gate logic circuit 2222, so that the over-current protection signal OCP_ENH will be outputted continuously by the over-current protection circuit 220 to latch the over-current protection state of the operational amplifier 210, before the system restarts.

Based on the similar principle, as shown in FIG. 5, under the normal operating state, the output voltage Vo of the operational amplifier 210 changes with the input voltage Vi. However, if the output terminal of the operational amplifier 210 is shorted to the power supply at time t3, the output voltage Vo of the operational amplifier 210 will rise to the potential (such as 18V) of the first power supply voltage VDDA. At this time, a current Iocn which flows through the second switch transistor Q2 in the output stage circuit of the operational amplifier 210 will rapidly increase and exceed the over-current threshold (such as 100 mA), and the second sampling signal GOP_SN sampled based on the second sampling resistor R2 will correspondingly increase to more than the second reference voltage Vref2, then the second comparison signal RSB_N received by the second input terminal of the first OR gate logic circuit 2215 becomes high level, so that the indication signal RSB outputted by the first OR gate logic circuit 2215 also becomes high level and the indication signal RSB of high level starts to charge the capacitor C1 in the low-pass filter at this time. If the voltage OCP_ENi across the capacitor C1 reaches the preset voltage threshold (for example, 0.7 VDDD) at time t4 after the preset time threshold T, the hysteresis comparator 2221 will output a high-level signal corresponding to the second power supply voltage VDDD at time t4, and the over-current protection signal OCP_ENH corresponding to the first power supply voltage VDDA is generated to turn off the operational amplifier 210 after the high-level signal corresponding to the second power supply voltage VDDD is converted by the third voltage conversion unit 2223. At the same time, the high-level signal outputted by the hysteresis comparator 2221 will also be fed back to the input terminal of the second OR gate logic circuit 2222, so that the over-current protection signal OCP_ENH will be outputted continuously by the over-current protection circuit 220 to latch the over-current protection state of the operational amplifier 210, before the system restarts.

In the present disclosure, whether the current inside the drive IC exceeds the steady state design current value for a long time is determined by detecting the output stage current of the operational amplifier, and if it is determined that the current inside the drive IC exceeds the steady state design current value for a long time, the over-current protection state is latched and the over-current protection signal is continuously outputted to turn off the corresponding circuit block, which can effectively prevent the drive IC from being damaged by the continuous large current flowing through the drive IC.

Furthermore, an over-current protection method is provided in the present disclosure, and the over-current protection method can be applied to the over-current protection circuit 220 described above to provide the over-current protection function for the operational amplifier 210 in the drive chip 200. As shown in FIG. 6, in the embodiments of the present disclosure, the over-current protection method comprises following steps:

In step S1, an output stage current of an operational amplifier is sampled, and an output stage current sampling signal is outputted.

In step S2, whether the output stage current of the operational amplifier exceeds a protection threshold is determined, based on a reference voltage and the output stage current sampling signal.

In step S3, whether the output stage current of the operational amplifier exceeds the protection threshold for a time that reaches a preset time threshold is determined, and an over-current protection signal is outputted to turn off the operational amplifier when the output stage current of the operational amplifier exceeds the protection threshold for a time that reaches the preset time threshold.

In the specific embodiments, the specific implementation of the steps in the over-current protection method can refer to the embodiments of the aforementioned over-current protection circuit, and will not be repeated herein.

It should be noted that, in addition to being applied to the above operational amplifier, the over-current protection circuit and the over-current protection method in the present disclosure can be used to provide the over-current protection function for other devices or circuit modules by simply changing the structure of the over-current protection circuit.

Finally, it should be noted that, obviously, the above embodiments are only examples to clearly illustrate the present disclosure, and are not intended to limit the implementation manner. For those skilled in the art, other changes or modifications in different forms can be made on the basis of the above description. It is unnecessary and impossible to exhaustively enumerate all embodiments herein. The obvious changes or modifications derived from this are still within the protection scope of the present disclosure.

What is claimed is:

1. An over-current protection circuit, used to provide an over-current protection for an operational amplifier, wherein the over-current protection circuit comprises:
    a comparison module, configured to compare a reference voltage and an output stage current sampling signal of the operational amplifier to determine whether an output stage current of the operational amplifier exceeds a protection threshold;
    a delay module, configured to determine whether the output stage current of the operational amplifier exceeds the protection threshold for a time that reaches a preset time threshold, and output an over-current protection signal to turn off the operational amplifier when the output stage current of the operational amplifier exceeds the protection threshold for a time that reaches the preset time threshold,
    wherein the over-current protection circuit further comprises:
    a state control module configured to respectively receive a first reset signal, a second reset signal and an over-current protection mode signal, and control the over-current protection circuit in an inoperative state when the first reset signal is valid, and/or the second reset signal is valid, and/or the over-current protection mode signal is invalid, wherein, the first reset signal is used to indicate whether a first power supply voltage is currently in a power on stage, the second reset signal is used to indicate whether a second power supply voltage is currently in a power on stage, and the over-current protection mode signal is used to indicate whether an over-current protection function is enabled.

2. The over-current protection circuit according to claim 1, wherein an output stage circuit of the operational amplifier comprises a first switch transistor, a second switch transistor, a first sampling resistor, and a second sampling resistor, wherein, the first switch transistor and the second switch transistor are connected in series between a power supply and a reference ground, the first sampling resistor is connected in series between the power supply and the first switch transistor, and the second sampling resistor is connected in series between the second switch transistor and the reference ground;
    the output stage current sampling signal comprises a first sampling signal and a second sampling signal, and the operational amplifier is configured to provide the first sampling signal and the second sampling signal to the over-current protection circuit based on the first sampling resistor and the second sampling resistor, respectively.

3. The over-current protection circuit according to claim 2, wherein the comparison module is configured to determine that the output stage current of the operational amplifier exceeds the protection threshold, when the first sampling signal is less than a corresponding first reference voltage or the second sampling signal is greater than a corresponding second reference voltage.

4. The over-current protection circuit according to claim 1, wherein the comparison module is configured to output an indication signal of high level, when the output stage current of the operational amplifier exceeds the protection threshold;
    the delay module is configured to charge a capacitor with the indication signal of high level and output the over-current protection signal when a voltage across the capacitor reaches a preset voltage threshold, to determine whether the output stage current of the operational amplifier exceeds the protection threshold for a time that reaches the preset time threshold according to a charging time for charging the capacitor by use of the indication signal of high level.

5. The over-current protection circuit according to claim 3, wherein the comparison module comprises a first comparator, a second comparator, and a first OR gate logic circuit, wherein, an inverting input terminal of the first comparator is configured to receive the first sampling signal, and a non-inverting input terminal of the first comparator is configured to receive the first reference voltage;

a non-inverting input terminal of the second comparator is configured to receive the second sampling signal, and an inverting input terminal of the second comparator is configured to receive the second reference voltage;

a first input terminal of the first OR gate logic circuit is coupled with an output terminal of the first comparator, a second input terminal of the first OR gate logic circuit is coupled with an output terminal of the second comparator, and an output terminal of the first OR gate logic circuit is configured to output an indication signal.

6. The over-current protection circuit according to claim 5, wherein a first power supply voltage serves as an operating voltage of the first comparator and an operating voltage of the second comparator, a second power supply voltage serves as an operating voltage of the first OR gate logic circuit, and the first power supply voltage is greater than the second power supply voltage;

the comparison module further comprises:

a first voltage conversion unit, which is connected in series between the output terminal of the first comparator and the first input terminal of the first OR gate logic circuit, and configured to convert a high-level signal corresponding to the first power supply voltage into the second power supply voltage, when the first comparator outputs that high-level signal corresponding to the first power supply voltage, wherein an operating voltage of the first voltage conversion unit is the second power supply voltage;

a second voltage conversion unit, which is connected in series between the output terminal of the second comparator and the second input terminal of the first OR gate logic circuit, and configured to convert a high-level signal corresponding to the first power supply voltage into the second power supply voltage, when the second comparator outputs that high-level signal corresponding to the first power supply voltage, wherein an operating voltage of the second voltage conversion unit is the second power supply voltage.

7. The over-current protection circuit according to claim 3, wherein the comparison module comprises a first comparator, a second comparator, a first inverter, a second inverter, and a first OR gate logic circuit, wherein, a non-inverting input terminal of the first comparator is configured to receive the first sampling signal, and an inverting input terminal of the first comparator is configured to receive the first reference voltage;

an inverting input terminal of the second comparator is configured to receive the second sampling signal, and a non-inverting input terminal of the second comparator is configured to receive the second reference voltage;

an input terminal of the first inverter is coupled with an output terminal of the first comparator;

an input terminal of the second inverter is coupled with an output terminal of the second comparator;

a first input terminal of the first OR gate logic circuit is coupled with an output terminal of the first inverter, a second input terminal of the first OR gate logic circuit is coupled with an output terminal of the second inverter, and an output terminal of the first OR gate logic circuit is configured to output an indication signal, wherein, a first power supply voltage serves as an operating voltage of the first comparator and an operating voltage of the second comparator, a second power supply voltage serves as an operating voltage of the first inverter, an operating voltage of the second inverter and an operating voltage of the first OR gate logic circuit, and the first power supply voltage is greater than the second power supply voltage.

8. The over-current protection circuit according to claim 4, wherein the delay module comprises a low-pass filter and a hysteresis comparator, the low-pass filter is coupled with the comparison module to receive the indication signal, and configured to delay and output the indication signal of high level;

an input terminal of the hysteresis comparator is coupled with an output terminal of the low-pass filter, and the hysteresis comparator is configured to output the over-current protection signal, when an output signal of the low-pass filter reaches the preset voltage threshold.

9. The over-current protection circuit according to claim 8, wherein the delay module is further configured to latch an over-current protection state triggered by the operational amplifier, after it is determined that the output stage current of the operational amplifier exceeds the protection threshold for a time that reaches the preset time threshold.

10. The over-current protection circuit according to claim 9, wherein the delay module further comprises a second OR gate logic circuit, a first input terminal of the second OR gate logic circuit is coupled with an output terminal of the comparison module, a second input terminal of the second OR gate logic circuit is coupled with an output terminal of the hysteresis comparator, and an output terminal of the second OR gate logic circuit is coupled with an input terminal of the low-pass filter.

11. The over-current protection circuit according to claim 8, wherein the delay module further comprises a third voltage conversion unit, an input terminal of the third voltage conversion unit is connected with the output terminal of the hysteresis comparator, and the third voltage conversion unit is configured to raise a voltage value of the over-current protection signal outputted by the hysteresis comparator to a first power supply voltage.

12. The over-current protection circuit according to claim 9, wherein the delay module further comprises a third voltage conversion unit, an input terminal of the third voltage conversion unit is connected with the output terminal of the hysteresis comparator, and the third voltage conversion unit is configured to raise a voltage value of the over-current protection signal outputted by the hysteresis comparator to a first power supply voltage.

13. The over-current protection circuit according to claim 10, wherein the delay module further comprises a third voltage conversion unit, an input terminal of the third voltage conversion unit is connected with the output terminal of the hysteresis comparator, and the third voltage conversion unit is configured to raise a voltage value of the over-current protection signal outputted by the hysteresis comparator to a first power supply voltage.

14. A display device, wherein the display device comprises:

a display panel;

a drive chip, configured to provide a drive signal for the display panel;

wherein, at least one operational amplifier and at least one over-current protection circuit according to claim 1 are arranged in the drive chip, and each of the at least one over-current protection circuit is configured to provide an over-current protection for a corresponding one of the at least one operational amplifier.

15. The display device according to claim 14, wherein an output stage circuit of the operational amplifier comprises a first switch transistor, a second switch transistor, a first sampling resistor, and a second sampling resistor, wherein, the first switch transistor and the second switch transistor are connected in series between a power supply and a reference ground, the first sampling resistor is connected in series between the power supply and the first switch transistor, and the second sampling resistor is connected in series between the second switch transistor and the reference ground;

the output stage current sampling signal comprises a first sampling signal and a second sampling signal, and the operational amplifier is configured to provide the first sampling signal and the second sampling signal to the over-current protection circuit based on the first sampling resistor and the second sampling resistor, respectively;

the comparison module is configured to determine that the output stage current of the operational amplifier exceeds the protection threshold, when the first sampling signal is less than a corresponding first reference voltage or the second sampling signal is greater than a corresponding second reference voltage.

16. The display device according to claim 14, wherein the comparison module is configured to output an indication signal of high level, when the output stage current of the operational amplifier exceeds the protection threshold;

the delay module is configured to charge a capacitor with the indication signal of high level and output the over-current protection signal when a voltage across the capacitor reaches a preset voltage threshold, to determine whether the output stage current of the operational amplifier exceeds the protection threshold for a time that reaches the preset time threshold according to a charging time for charging the capacitor by use of the indication signal of high level.

17. An over-current protection method used to provide an over-current protection for an operational amplifier with an over-current protection circuit according to claim 1, wherein the over-current protection method comprises:

sampling an output stage current of the operational amplifier, and outputting an output stage current sampling signal;

determining whether the output stage current of the operational amplifier exceeds a protection threshold, based on a reference voltage and the output stage current sampling signal;

determining whether the output stage current of the operational amplifier exceeds the protection threshold for a time that reaches a preset time threshold, and outputting an over-current protection signal to turn off the operational amplifier when the output stage current of the operational amplifier exceeds the protection threshold for a time that reaches the preset time threshold.

\* \* \* \* \*